United States Patent
Joshi et al.

(10) Patent No.: US 10,932,360 B2
(45) Date of Patent: Feb. 23, 2021

(54) FLEXIBLE SENSOR TECHNOLOGY

(71) Applicant: UT-Battelle, LLC, Oak Ridge, TN (US)

(72) Inventors: Pooran C. Joshi, Oak Ridge, TN (US); Stephen M. Killough, Oak Ridge, TN (US); Phani Teja V. Kuruganti, Oak Ridge, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 90 days.

(21) Appl. No.: 16/514,868

(22) Filed: Jul. 17, 2019

(65) Prior Publication Data

US 2020/0029427 A1   Jan. 23, 2020

Related U.S. Application Data

(63) Continuation of application No. 62/700,390, filed on Jul. 19, 2018.

(51) Int. Cl.
*G01R 1/20* (2006.01)
*H05K 1/02* (2006.01)
(Continued)

(52) U.S. Cl.
CPC ............ *H05K 1/0277* (2013.01); *G01R 1/203* (2013.01); *G01R 15/00* (2013.01); *G01R 15/16* (2013.01);
(Continued)

(58) Field of Classification Search
CPC ................ G01R 19/0092; G01R 1/203; G01R 19/0084; G01R 15/16; G01R 21/06;
(Continued)

(56) References Cited

U.S. PATENT DOCUMENTS 6,731,193 B2   5/2004   Meier et al.
6,940,266 B2   9/2005   Roden et al.
(Continued)

FOREIGN PATENT DOCUMENTS

EP   2754338 B1   8/2015
JP   6479370 B2   3/2019
(Continued)

OTHER PUBLICATIONS

Yamashita, T. et al, "Thin film based flexible current clamp sensor for green wireless sensor networks," Sensors, 2014 IEEE, DOI: 10.1109/ICSENS.2014.6985106 (abstract only).

*Primary Examiner* — Raul J Rios Russo
(74) *Attorney, Agent, or Firm* — Lempia Summerfield Katz LLC

(57) ABSTRACT

A system and method (referred to as a method) to fabricate sensors and electronic circuits. The method prints a first thin-film having an electronic conductivity of about less than a millionth of a Siemens per meter and a permalloy directly onto the first thin-film. The permalloy has a magnetic permeability greater than a predetermined level and has a thickness within a range of about 1 to 20 microns. The system prints a second thin-film directly onto the permalloy to encapsulate the permalloy onto the first thin-film and prints conductive traces directly onto the surfaces of the first-thin-film, the permalloy, and the second thin-film. In some applications, a sensor is packaged in an additively manufactured three-dimensional cylindrical shape that can be mounted on or is a unitary part of a current carrying conductor without incising, sharing, or severing (e.g., cutting) the current carrying conductor or its insulation.

21 Claims, 10 Drawing Sheets

(51) Int. Cl.
| | |
|---|---|
| *H05K 3/28* | (2006.01) |
| *H05K 1/09* | (2006.01) |
| *H05K 3/12* | (2006.01) |
| *G01R 15/00* | (2006.01) |
| *G01R 19/00* | (2006.01) |
| *H05K 1/16* | (2006.01) |
| *G01R 15/16* | (2006.01) |
| *G01R 21/06* | (2006.01) |
| *G01R 35/00* | (2006.01) |
| *G01R 15/18* | (2006.01) |
| *G01R 19/25* | (2006.01) |

(52) U.S. Cl.
CPC ......... *G01R 15/18* (2013.01); *G01R 19/0084* (2013.01); *G01R 19/0092* (2013.01); *G01R 19/2513* (2013.01); *G01R 21/06* (2013.01); *G01R 35/005* (2013.01); *H05K 1/09* (2013.01); *H05K 1/16* (2013.01); *H05K 3/1283* (2013.01); *H05K 3/28* (2013.01); *H05K 2201/09227* (2013.01); *H05K 2201/10151* (2013.01)

(58) Field of Classification Search
CPC .. G01R 35/005; G01R 15/18; G01R 19/2513; G01R 15/00; H05K 1/0277; H05K 3/28; H05K 1/09; H05K 3/1283; H05K 1/16; H05K 2201/09227; H05K 2201/10151; H05K 1/0284; H05K 2201/09672; H05K 2201/10098; H05K 2203/1131; H05K 1/165; H05K 2201/086; H05K 3/146; H05K 3/0014; H05K 1/036
USPC .................. 324/76.11–76.83, 115, 126, 149
See application file for complete search history.

(56) References Cited

U.S. PATENT DOCUMENTS

| | | |
|---|---|---|
| 6,965,225 B2 | 11/2005 | de Buda |
| 8,816,698 B2 | 8/2014 | Ganesh et al. |
| 9,494,620 B2 | 11/2016 | Dames et al. |
| 9,535,130 B2 | 1/2017 | Labbe et al. |
| 10,571,642 B1* | 2/2020 | Cohen ..................... G02B 6/25 |
| 2015/0197063 A1* | 7/2015 | Shinar ..................... G06F 30/00 700/98 |
| 2015/0201500 A1* | 7/2015 | Shinar .................. B29C 64/135 425/132 |
| 2016/0134327 A1 | 5/2016 | Joshi et al. |
| 2016/0223594 A1 | 8/2016 | Suzuki et al. |

FOREIGN PATENT DOCUMENTS

| | | |
|---|---|---|
| WO | 2016130265 A1 | 8/2016 |
| WO | 2018206953 A1 | 11/2018 |

* cited by examiner

FLEXIBLE SENSOR TECHNOLOGY

PRIORITY CLAIM

This application claims priority to U.S. Provisional Patent Application No. 62/700,390, filed on Jul. 19, 2018, which is herein incorporated by reference.

STATEMENT REGARDING FEDERALLY SPONSORED RESEARCH AND DEVELOPMENT

These inventions were made with United States government support under Contract No. DE-AC05-00OR22725 awarded by the United States Department of Energy. The United States government has certain rights in the inventions.

BACKGROUND OF THE DISCLOSURE

Technical Field

This application relates to flexible circuits and specifically to customizable flexible circuits.

Related Art

Buildings consume a significant amount of energy. Building owners, designers, and operators are challenged to reduce the environmental impacts of buildings, including their energy consumption and their associated greenhouse gas emissions, while maintaining their control of indoor environments to ensure they are conducive to their occupants' health, safety, and productivity. Many buildings have no automation systems and no sensors. Other buildings with automation systems have very few sensors, which limits the amount of energy savings that can be realized with active monitoring.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The elements in the figures are not necessarily to scale, emphasis instead being placed upon illustrating the principles of the disclosure. Moreover, in the figures, like referenced numerals designate corresponding parts throughout the different views.

DETAILED DESCRIPTION

Figure 1:
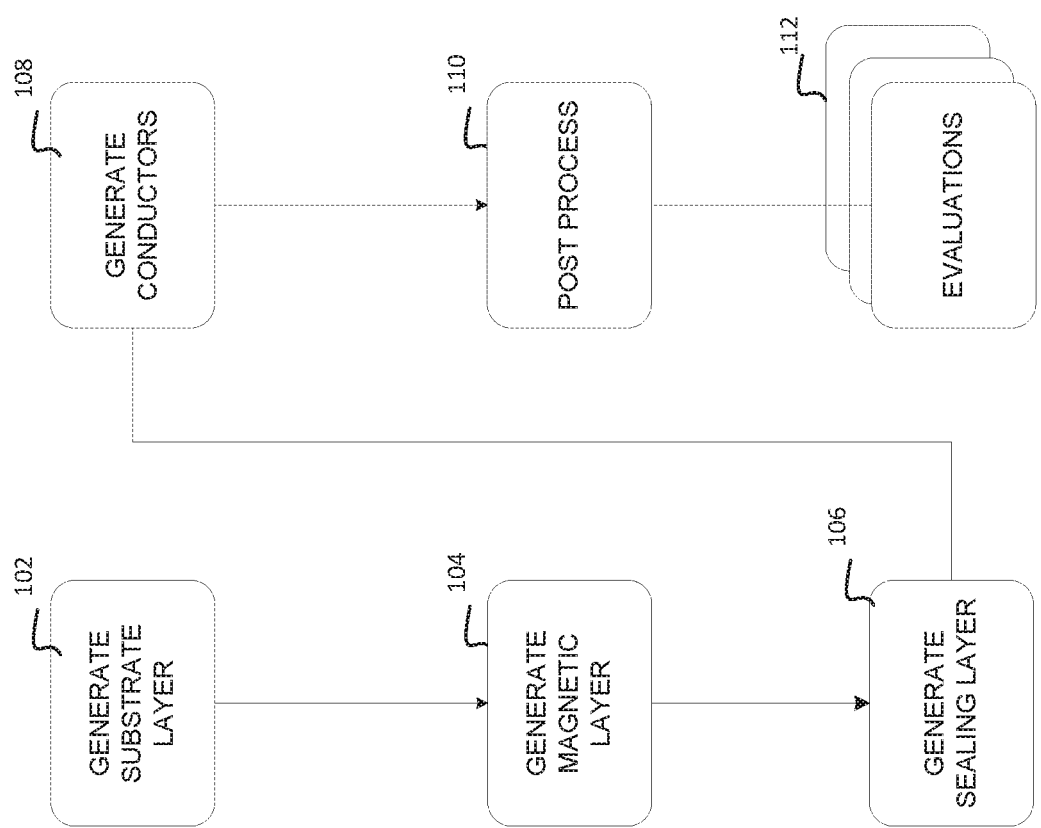
FIG. 1 Illustrates a multilayer circuit fabrication.

Flexible-printed sensors and electrical circuits provide a high reliability and a variable form factor without physical or vapor deposition, or screen printing. The systems accommodate small high-density designs that reduce assembly times and can be customized to many applications on demand. The flexible electrical circuits can be moved, bent, and subject to torsional stress without affecting the integrity or the reliability of the circuits. The printed electrical circuits' widths mitigate thermal operating states and improve temperature control due to their thin and light weight structure that is conducive to ambient and mechanical cooling. Because fewer traditional connections are required to join the disclosed electrical circuits such as solder joints and interconnecting hardware, for example, the flexible-printed circuits are easy to produce. Further, the fabrication processes produce high production yields and their designs can exploit one-way assembly techniques eliminating the defects that sometimes occur when circuits are moved during the fabrication process. Further, the flexible-printed electrical circuits require less material to produce and can be printed on any shape, which saves space in product designs and reduces final product weights.

The disclosed flexible-printed electrical circuits are rendered from an advanced manufacturing technology that renders highly accurate and customizable circuit features. Some flexible-printed electrical circuits improve energy consumption monitoring (for better control) which reduces maintenance and reliability costs. The flexible-printed electrical circuits are well suited for continuous and periodic movement whether the flexible-printed electrical circuits are monitoring or controlling one or more vehicles or one or more buildings as they are adaptable to extreme outside environments including extreme heat, cold, and/or vibration.

Unlike processes that create small circuit features by physical/vapor deposition or large circuit designs that rely on stencil/screen printing (e.g., circuits fabricated by deposits of solder paste on printed circuit boards), the disclosed systems and processes (referred to as a system or systems) create micron and Nano size flexible-printed sensors and electrical circuits by printing high-resolution depositions on thin-films. In some applications, micron sized (e.g., ~0.5-100 µm) electrical circuit features are deposited on micron-sized films (e.g., ~1-100 µm) through non-contact printing. Because there is no physical contact between the flexible-printed electrical circuits and the printer's nozzle, three-dimensional electrical circuit features can be fabricated onto any shape or supporting base. The flexible-printed electrical circuits are fabricated by printing the electrical circuits and/or traces directly on the contoured surfaces that make up the underlying material. This fabrication-in-place technology improves the mechanical stability of the electrical circuits and/or traces because the printed elements and traces are fabricated (i.e., printed) directly onto any of the physical surfaces of a base or surface or even the surfaces of the object the printed electrical circuits monitor, communicate with, or are a unitary part of. In some applications, traces and electrical circuit features are helically deposited directly around or about outer surfaces of electrical circuit elements, or directly deposited on stair step-like elevations, and/or directly bridge one or more non-planar elevations of an object, while maintaining continuity without bonding, interconnects, or solder connections. Further, print media used to fabricate the electrical circuits and/or conductive traces may comprise any materials including any composite inks, conductive metallic inks, that include for example, copper, silver, nickel, etc., insulating materials, adhesives, etc. rendering a turnkey fabrication system via a digital printer.

Figure 10:
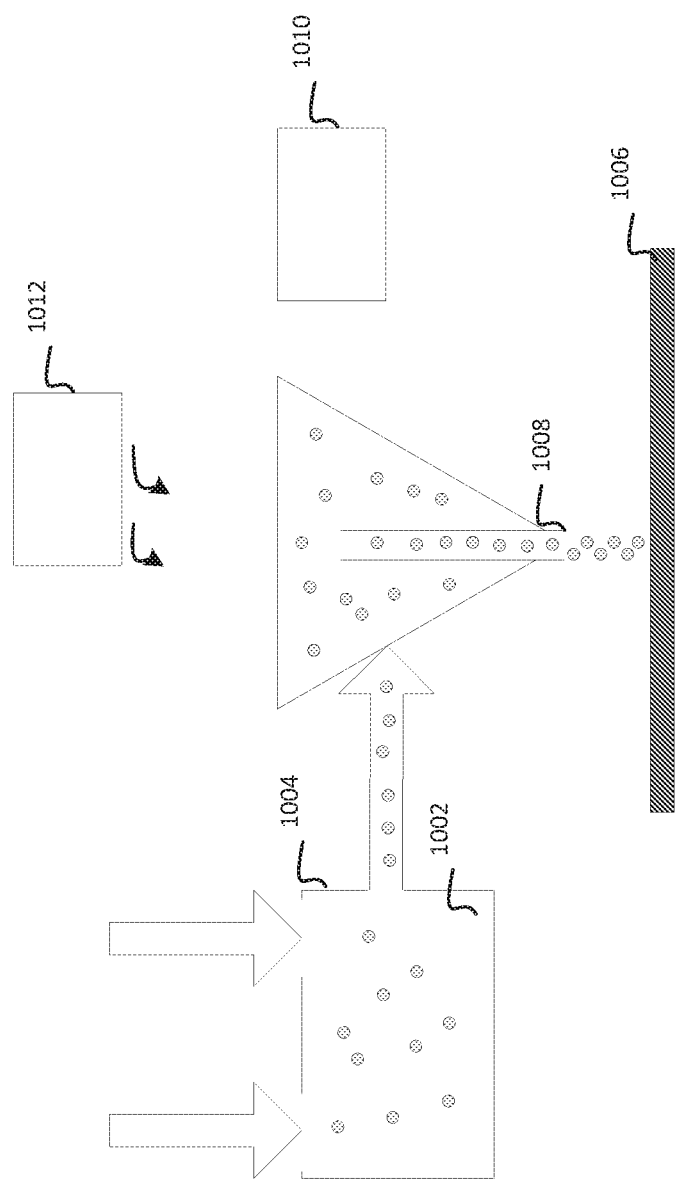
FIG. 10 illustrates a block diagram of a printer executing a portion of a deposition process.

An atomized raw material or metal 1002 such as silver or copper (Ag or Cu), for example, is aerosolized through an ultrasonic or pneumatic atomizer 1004 and deposited on and cured or sintered to a planar and/or non-planar thin-film supported by a computer-controlled platen 1006 and 1112 as shown in FIG. 10. Some systems use low-pressure gas induced computer-controlled narrow-flat nozzles 1008 and 1112 to deposit electrical circuit features and/or traces through a focused aerosolized beam of less than ~0.5-100 μm (e.g., a fractional width of the size of the nozzle orifice). Drift may render the ~0.5-100 μm electrical circuit features. Some systems also use curing and/or sintering using an integrated computer-controlled microwave modules and/or integrated computer-controlled laser modules 1010 to cure and/or sinter the electrical circuit features at low fabrication temperatures (e.g., below the melting point of the thin-films such as below about 100° C., for example) without damaging the electrical circuits or striking the thin-films and/or permalloy. The systems render high-quality and consistent electrical circuit features at nozzle boom heights of about ~3-5 mm positioned above the thin-film or platen 1006 supporting thin-films that mitigates drift and ensure uniform electrical circuit element densities for conductive and/or insulating fabrications through the computer control 1012 (shown as a wireless control).

All of the disclosed systems described herein fabricate capacitors, resistors (e.g., linear and non-linear electrical circuit elements), gates, switches, thin-film transistors, radio frequency identifiers, temperature sensors, Relative Humidity Sensors (RHS), stress and strain sensors, Volatile Organic Compound sensor (VOCs), gas detection electrical circuits, current sensors, wireless sensors, self-powered electrical circuits, antennas, alternating current (AC), direct current (DC) circuits, harmonic measuring electrical circuits, biosensors and/or other electrical circuits and elements at room temperature. Both the materials and manufacturing processes facilitate fabrication in any environment (not just clean rooms) and facilitate the mass fabrication of nearly any electronic circuits at a low cost.

Figure 2:
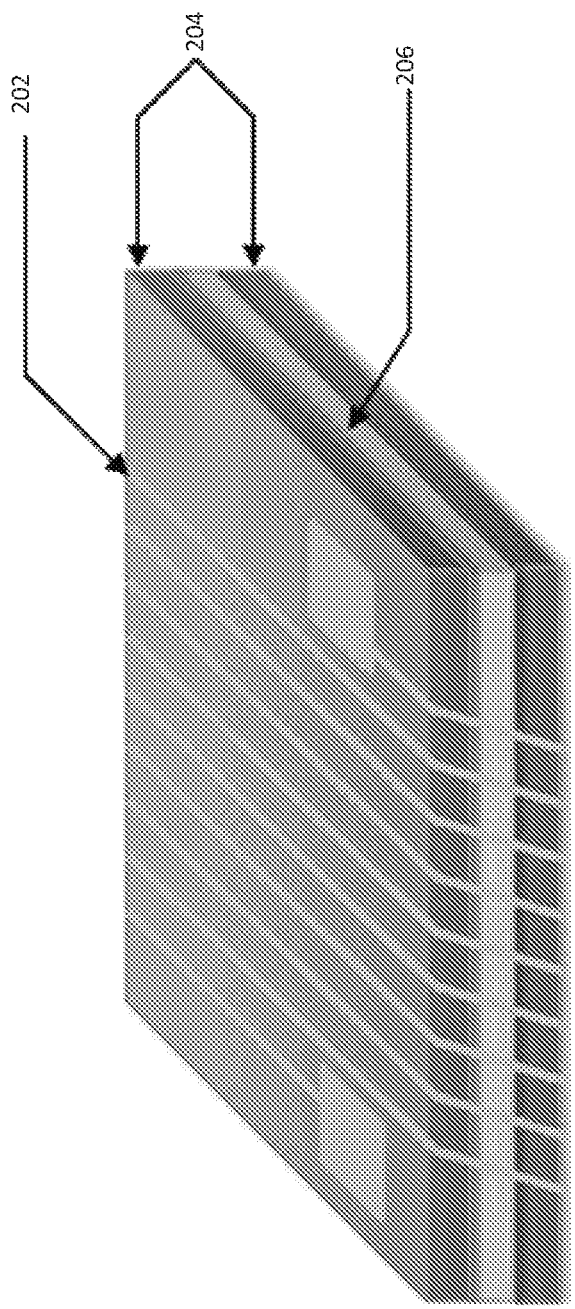
FIG. 2 illustrates a multilayer printed current sensor.

FIG. 1 illustrates a multilayer electrical circuit fabrication using an additive manufacturing process. A magnetic material is dispersed and/or printed on a flexible thin-film to form a magnetic layer 206 (shown in FIG. 2) at 104. The flexible thin-film may be printed from a polyamide ink formulation via a three-dimensional printer to render an about ~5-100 μm thick substrate or the first dielectric 204 (shown in FIG. 2) at 102. In some exemplary use cases, the magnetic layer 206 comprised a permalloy having a thickness of about ~1-20 μm and a variable or fixed magnetic permeability greater than a predetermined level. In one exemplary use case, the permalloy had a thickness of about 12.5 μm and a relative magnetic permeability greater than about 60,000. A second dielectric 204 (shown in FIG. 2) partially or fully encapsulates or seals the magnetic layer 206 to the first dielectric at 106. In the exemplary use case referred to above, the second dielectric 204 comprised a second flexible thin-film printed from the polyamide ink formulation via the three-dimensional printer at a thickness in the range of about ~1-100 μm. The term dielectric refers to a nonconductor of electricity including substances having an electronic conductivity of less than a millionth ($10^{-6}$) of a Siemens per meter. The term permalloy refers magnetizable and de-magnetizable homogenous mixture or material comprised of greater than about 70% of some combination of nickel, iron, and/or cobalt.

Figure 3:
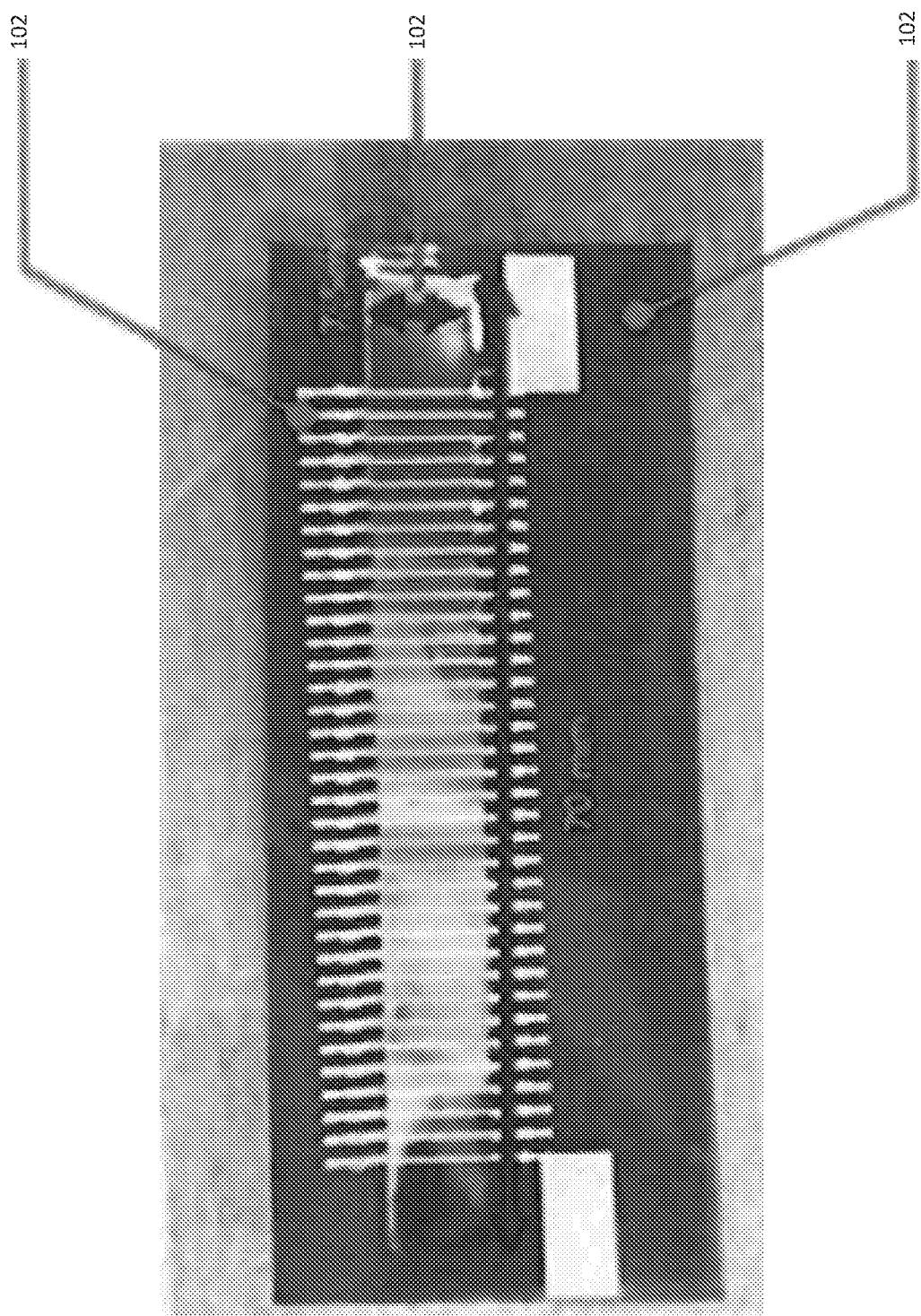
FIG. 3 illustrates an alternate multilayer printed current sensor.

At any of the process step of FIG. 1, conductors 202 (shown in FIG. 2) may be printed on the dielectric 206 and/or magnetic layers 206. At 108 of FIG. 1, continuous or electrically isolated conductive traces 202 (or electrical circuit elements) are printed on any combination of exposed surfaces including a top, a bottom, and/or side surfaces of the flexible-printed electrical circuits. In the exemplary use case, an axial flow of silver and a sheath gas flowing through the narrow-flat nozzles 1008 deposited conductive pads and a continuous conductive trace nearly equally spaced around and in a substantially parallel alignment. The continuous conductive traces helically transverse the top surface, the bottom surface, and two side surfaces and pass over the dielectric layers 204 and the magnetic layer 206 between the two conductive pads shown in FIGS. 2 and 3. The result is a light weight low cost flexible printed-current sensor. An optional post processing cures or sinters the conductive pads and helix-like conductive traces 202 to the dielectric layers 204 and the magnetic layer 206 that is tested and validated by one or more electrical circuit evaluations at 112 and thereafter calibrated (not shown). The electrical current sensor thus formed is a passive sensor that does not require power for its operation. As a result, in the exemplary use case, the signal response from the flexible printed-current sensor was collected by an electronic circuit powered through a Universal Serial Bus (USB) in one application and an equivalent six-volt DC battery in another application.

Figure 4:
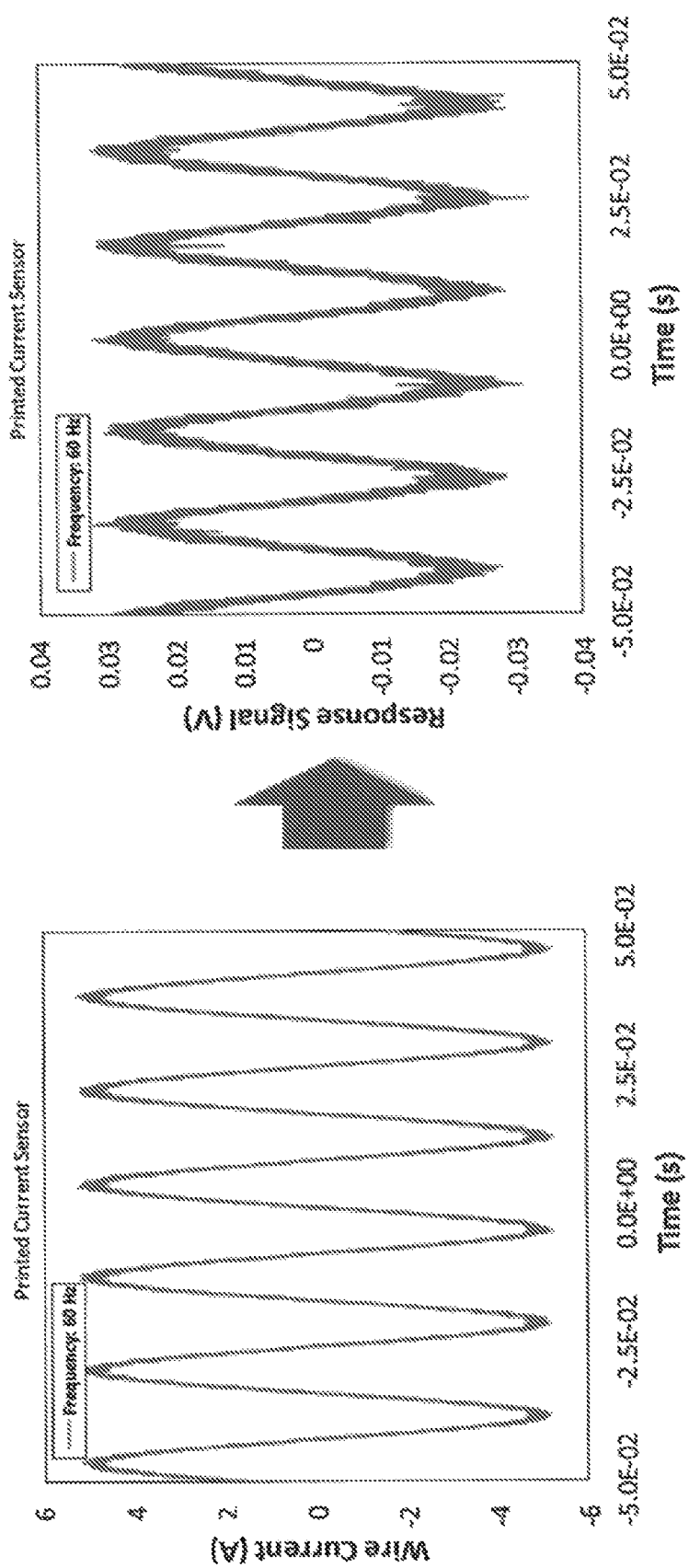
FIG. 4 illustrates the linear response of the multilayer printed current sensor of FIG. 2 monitoring a 60 Hz signal.
Figure 5:
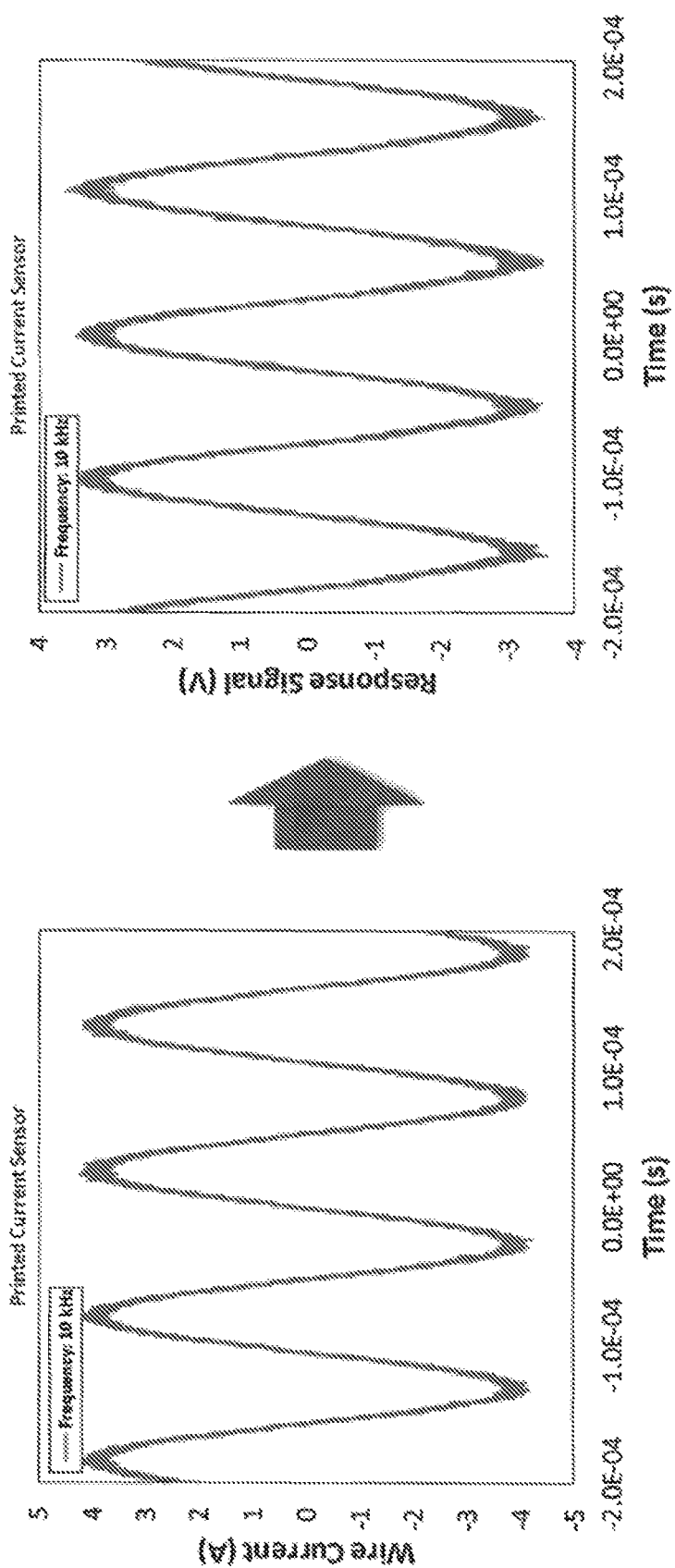
FIG. 5 illustrates the linear response of the multilayer printed current sensor of FIG. 2 monitoring a 10 kHz signal.
Figure 6:
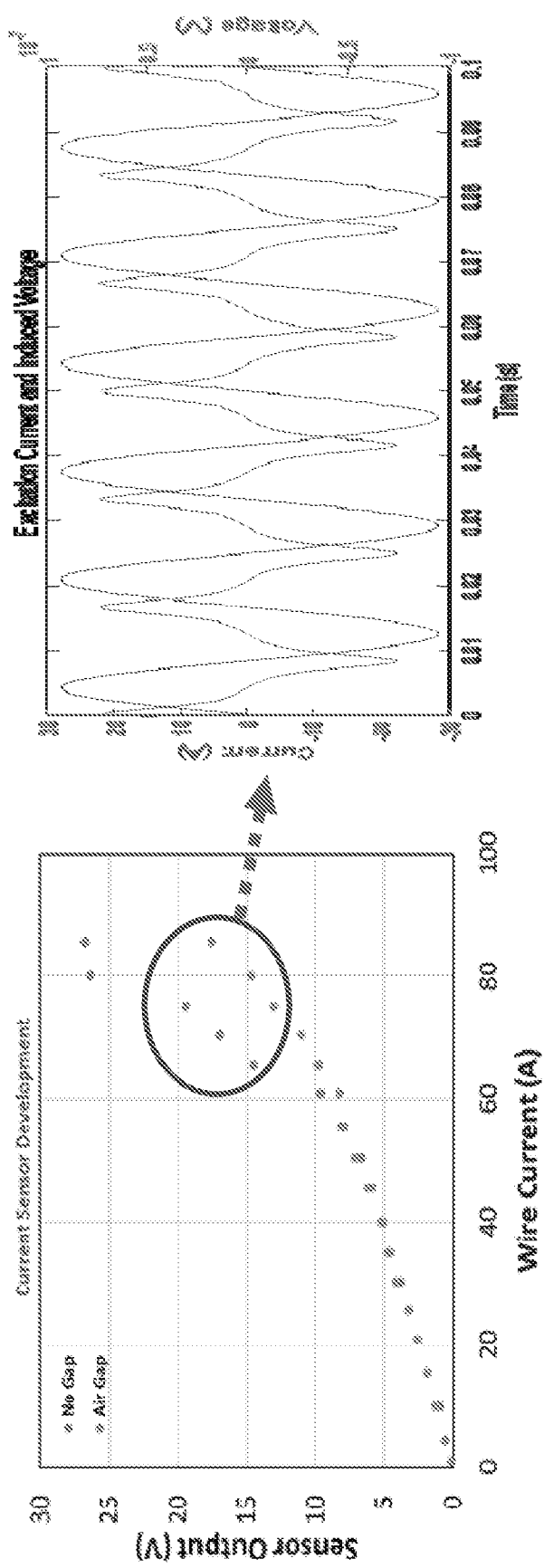
FIG. 6 illustrates the linear response of the multilayer printed current sensor of FIG. 2 monitoring up to a 50 Amp peak-to-peak alternating current.
Figure 7:
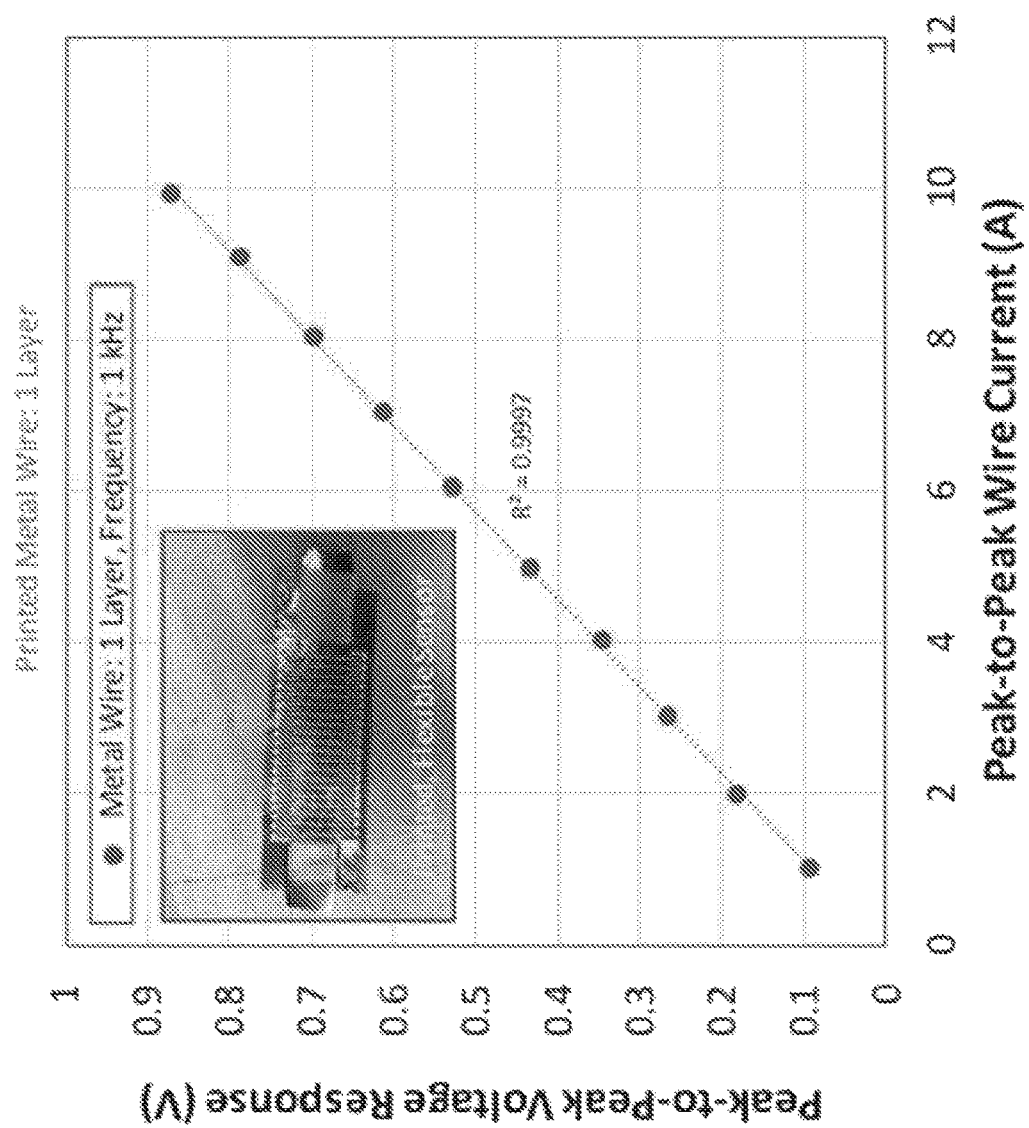
FIG. 7 illustrates the linear response of the multilayer printed current sensor of FIG. 2 monitoring a 10 Amp peak-to-peak alternating current.

FIGS. 4 and 5 show the flexible printed-current sensor's performance rendered by an exemplary use case at about 60 Hz (Hertz) and at about 10 kHz (kilo-Hertz), respectively. FIG. 6 illustrates the linear response of the multilayer printed current sensor monitoring up to a 50 Amp peak-to-peak alternating current. As shown, the flexible printed-current sensor scales well within the 60 Hz-10 kHz range as substantially no signal saturation is detected in the range of 1-100 Amps (A) or 50 A peak-to-peak. FIG. 7 shows the flexible printed-current sensor's response up to at least 10 A peak-to-peak AC current. In FIG. 7, the total thickness of the sensor is less than about 500 μm using a 12.5 μm thick permalloy as the magnetic layer 206. As shown, the substantially linear response does not show any substantial signal saturation.

Figure 8:
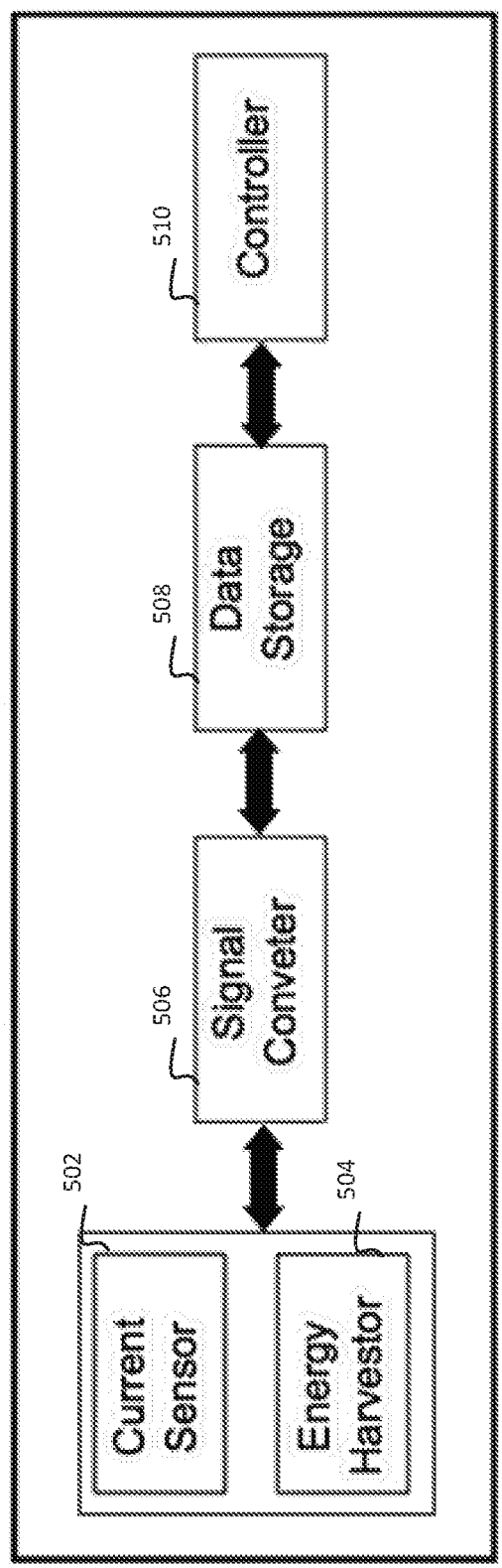
FIG. 8 illustrates a printed circuit's integration into a control system.

In FIG. 8, a flexible-printed current sensor 502 is integrated with an ambient energy harvesting unit to power the signal processing and data storage components. Alternatively, the flexible-printed current sensor 502 may include a built-in power source (not shown; e.g., an active flexible-printed current sensor) or fabricated with an inductive element 504 and/or an antenna (e.g., a passive flexible-printed current sensor). The energy can be harvested from heat, mechanical vibration, indoor lighting, electromagnetic fields and airflow. The inductive element 504 and/or antenna of the flexible-printed current sensor detect and convert the magnetic or radio frequency signals transmitted from the monitored line or an external source (both not shown) into power that drives the electronic circuit connected to flexible-printed current sensor 502. Upon power up, the flexible-printed current sensor 502 measures the power in the monitored line or system, which is than translated into a digital signal. A signal converter 506 converts the continuously varying signal generated by the flexible-printed current sensor 502 into a succession of discrete digital values that are stored in local memory 508 that was fabricated by the printing process disclosed herein. A control circuit 510 such as an intelligent processing unit (IPU), central processing unit (CPU), and/or graphics processing unit (GPU) that is remote from the flexible-printed current sensor 502 and the memory 508 in some systems and local to and a unitary part of the flexible-printed current sensor 502 and memory 508 in alternate systems, receives the current measurement signals from the flexible-printed current sensor 502 and/or memory 508. The control circuit 510 generates logical control signals to control a targeted device (not shown), such as for example an electrical grid or a heating, ventilation, and air conditioning system. In some system, the control circuit 510 issues commands that are intended to reconfigure the controlled device, alter the operating condition of the controlled device, or manage characteristics of the controlled device.

When the control circuit 510 is remote from the flexible-printed current sensor 502, a flexible-printed circuit incorporates a transceiver and is a unitary part of the flexible-printed current sensor 502. The transceiver comprises a transmitter and receiver that converts data from one protocol to another via encoding and/or decoding to a form that is usable for its transmission and/or usable for processing.

Figure 9:
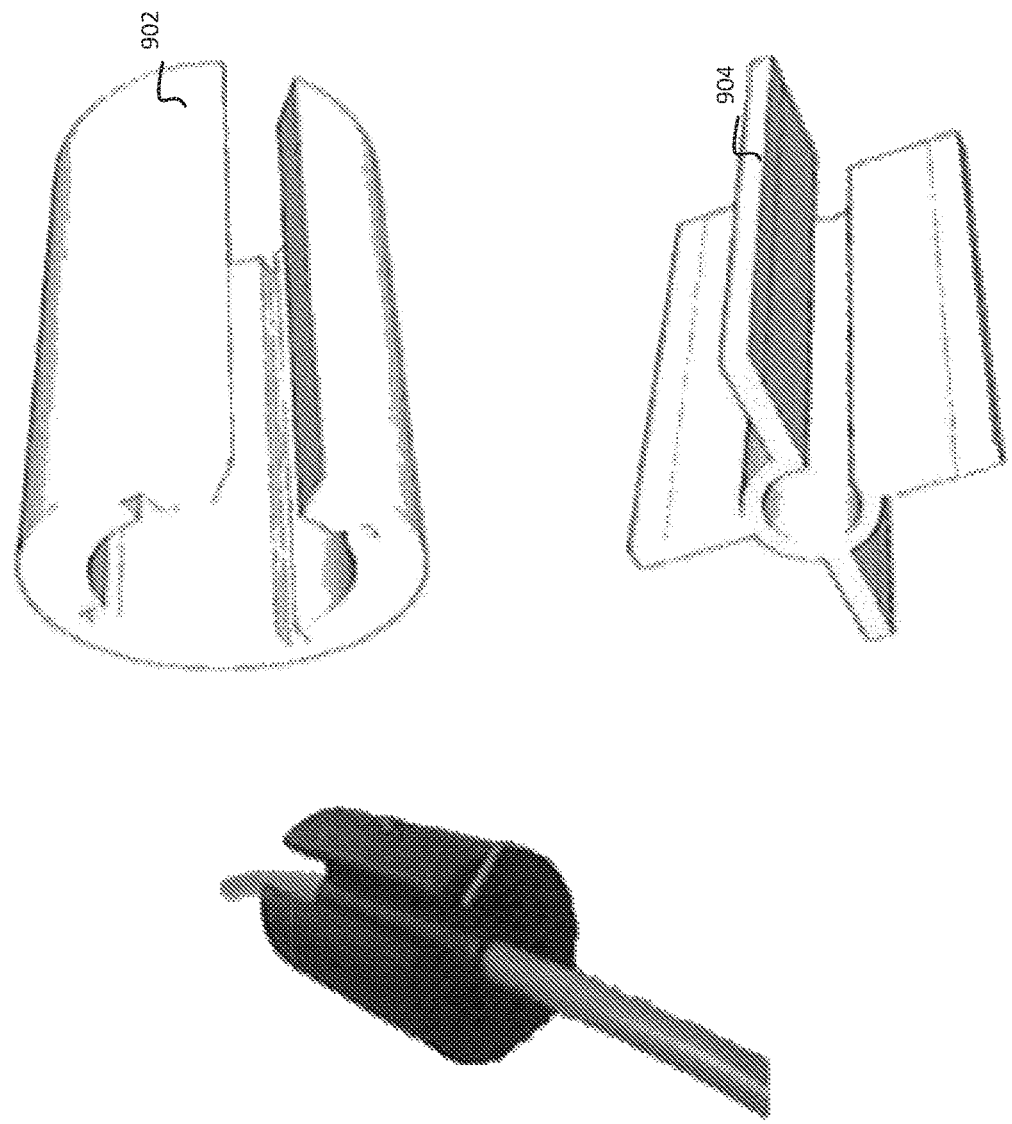
FIG. 9 illustrates a plurality of printed sensors.

The integrated flexible-printed current sensor 502 shown in FIG. 8 (e.g., monitoring hardware) can take many form factors and measure current of a targeted device without splicing into the targeted line or targeted circuit it is monitoring like known ammeters. As shown in FIG. 9, an axially balanced thermal conductive cylinder-like sleeve 902 that in some versions include thermal conductive fins 904 are fabricated with or directly printed on or are formed as a unitary part of the targeted conducting line or operating circuit. The printing may use a two-dimensional and/or three-dimensional additive manufacturing techniques. The additive manufacturing techniques in some use cases process flexible or rigid thermoplastic or thermosetting plastic that facilitates thermal conductivity in a form factor that allows the monitoring hardware to replace conventional conducting line or operating circuit (e.g., the monitored object) that may not have included the monitoring hardware. The monitoring hardware may take many sizes, have varying degrees of rigidity or flexibility, and take many shapes such as a cylindrical shape that may include an optional opening of various dimensions sized to receive the monitored object and wrap fully or partially around it. In some instances, the enclosure of the monitored object protects the monitored object from its environmental surroundings. In other use cases, the monitoring hardware provides even more protection as they do not include the optional opening. In these use cases, the monitoring object is a unitary part of the monitored objected.

Some thermal conducting cylindrical shapes include protruding thermal conductive fins that may fully or partially encapsulate a monitored object like the wire shown in FIG. 9. The thermal conducting cylindrical shape and protruding thermal conductive fins are a unitary part of the flexible-printed current sensor 502 in FIG. 9 and provide a high thermal conductivity and stronger structural integrity than joined or integrated devices. As shown, the cylindrical shape and fins are fabricated with and form a unitary part of integrated flexible-printed current sensor 502, and in some instance are directly printed on the monitored or targeted circuit or object, and in some instanced form a unitary part of the targeted circuit or object it is intended to monitor and/or control. Neither of the flexible-printed current sensors encapsulated in the cylinder-like sleeve 902 and thermal conductive fins 904 shown in FIG. 9 are soldered or brazed. Neither of the flexible-printed current sensors shown require a thermal adhesive or thermal grease to improve its heat sink performance by filling in air gaps between the heat sink and the fins and cylindrical shape that dissipates the heat. The integrated flexible-printed current sensors are thermally efficient and durable heat exchangers because they are the electrical circuits that are designed to measure current (electrical function) and dissipate heat (mechanical function). The designs maximize the surface area to the cooling medium through form factors and precisely fabricated protrusions.

The memory 508 and/or storage disclosed above may also retain an ordered listing of executable instructions for implementing the functions described above or executed by the other circuits and sensors described herein in a non-transitory computer code executable by a hardware processor (e.g., an IPU, a CPU, a GPU, etc.). The machine-readable medium may selectively be, but not limited to, an electronic, a magnetic, an optical, an electromagnetic, an infrared, or a semiconductor medium. A non-exhaustive list of examples of a machine-readable medium includes: a portable magnetic or optical disk, a volatile memory, such as a Random-Access Memory (RAM), a Read-Only Memory (ROM), an Erasable Programmable Read-Only Memory (EPROM or Flash memory), or a database management system. The memory 508 may comprise a single device or multiple devices that may be disposed on one or more dedicated memory devices or disposed within the processor or other similar device.

While each of the systems and methods shown and described herein operate automatically and operate independently, they also may be encompassed within other systems and methods including any number of iterations of some or all of the process and systems used to fabricate the electrical circuit and/or the circuit features. Alternate systems may include any combinations of structure and functions described or shown in one or more of the FIGS. and can be fabricated by printing a variety of materials including polymers and sealants. Printings can be made on any surface that can be printed to allow the system to fabricate turn-key electrical circuits using a single device and few processes.

Many devices that are conventionally manufactured can be fabricated in two and three dimensions as described herein including Nano and submicron electrical circuits. Because fabrication materials are controlled through a computer 1012 or processor, automation controls the flow rate of materials and gas flow through the printing nozzle 1008, the position and movement of the printing nozzle 1008, and the position and movement of a supporting plate 1006 that holds the circuit layers. Thus, waste is minimized and the fabricating steps are less than conventional methods. The disclosure describes a combination of direct-write printing and low temperature curable conductive/metallic mediums that are used in some systems to fabricate any electrical circuit including the flexible-printed current sensor technology described. The disclosed integrated approach enables flexible fabrication design in customized two-dimensional and three-dimensional configurations that achieve a high sensitivity and a broad operating range efficiency. It has many applications including buildings and smart grid applications, for example.

The flexible-printed electrical sensors and circuits provide a high reliability and a variable form factor without physical/vapor deposition or screen printing. The flexible electrical circuits can be moved, bent, and subject to torsional stress and in some instances, cuttable based on the application requirements without affecting the integrity or the reliability of the printed electrical circuits. The printed electrical circuits' widths mitigate thermal operating states and improve temperature control due to their thin and light weight structure. Because fewer traditional connections are required to join the disclosed electrical circuits, the flexible-printed electrical circuits are easy to produce. Further, the fabrication processes produce high production yields and can be printed on any base-shape, which saves space and reduces final product weights.

As expressed herein, functions, steps, etc. are said to be "responsive to" or occur "in response to" another function or step, etc., the functions or steps necessarily occur as a result of another function or step, etc. It is not sufficient that a function or act merely follow or occur subsequent to another. The term "substantially" or "about" encompasses a range that is largely (anywhere a range within or a discrete number within a range of ninety-five percent and one-hundred and five percent), but not necessarily wholly, that which is specified. It encompasses all but an insignificant amount.

Other systems, methods, features and advantages will be, or will become, apparent to one with skill in the art upon examination of the figures and detailed description. It is intended that all such additional systems, methods, features and advantages be included within this description, be within the scope of the disclosure, and be protected by the following claims.

What is claimed is:

1. A method a fabricating an electrical circuit, comprising:
   printing a first thin-film having an electronic conductivity of less than a millionth of a siemens/m;
   printing a permalloy directly onto the first thin-film having a magnetic permeability greater than a predetermined level having a thickness within a range of about 1 to 20 microns;
   printing a second thin-film directly onto the permalloy to encapsulate the permalloy onto the first thin-film; and
   printing a plurality of conductive traces directly onto a plurality of surfaces of the first-thin-film, the permalloy, and the second thin-film to render a current sensor.

2. The method of claim 1 where the first thin-film has a thickness of about 1-100 microns.

3. The method of claim 1 were the first thin-film and the second thin-film has a thickness in the range of 1 to 20 microns.

4. The method of claim 1 where the predetermined level ranges from about 100-100,000.

5. The method of claim 1 where the conductive traces are formed from an aerosolized silver.

6. The method of claim 1 where the conductive traces are formed from an aerosolized copper.

7. The method of claim 1 further comprising sintering the plurality of conductive traces by applying a single wavelength or broad wavelength energy directly to the plurality of conductive traces without striking the first thin-film, the second thin-film, and the permalloy.

8. The method of claim 1 further comprising curing the conductive traces at a low thermal temperature.

9. The method of claim 1 further comprising printing a plurality of thermal conductive fins on the current sensor as it is rendered.

10. The method of claim 1 further comprising printing a thermal conductive cylindrical element on the current sensor as it is rendered.

11. The method of claim 1 where the plurality of conductive traces is printed continuously in a helix like shape.

12. An electrical system comprising:
    a first thin-film having an electronic conductivity of less than a millionth of a siemens per meter;
    a permalloy directly printed onto the first thin-film having a magnetic permeability greater than a predetermined level having a thickness within a range of about 1 to 20 microns;
    a second thin-film printed directly onto the permalloy that encapsulates the permalloy onto the first thin-film; and
    a plurality of conductive traces printed directly onto a plurality of surfaces of the first-thin-film, the permalloy, and the second thin-film.

13. The system of claim 12 where the first thin-film has a thickness of about 1-100 microns.

14. The system of claim 12 were the first thin-film and the second thin-film has a thickness in the range of 1 to 20 microns.

15. The system of claim 12 where the predetermined level ranges from about 100-100,000.

16. The system of claim 12 where the conductive traces are formed from an aerosolized silver.

17. The system of claim 12 where the conductive traces are formed from an aerosolized copper.

18. The system of claim 12 where the plurality of conductive traces is sintered onto the first thin-film.

19. The system of claim 12 where the first thin-film, the permalloy, and the second thin-film are a unitary part of a plurality of thermal conductive fins.

20. The system of claim 12 where the first thin-film, the permalloy, and the second thin-film are a unitary part of a thermal conductive cylindrical element.

21. A method a fabricating a sensor mounted to a cable without incising, shearing, or severing the cable, comprising:
    printing a first thin-film having an electronic conductivity of less than a millionth of a siemens/m in a first cylindrical form;
    printing a permalloy directly onto the cylindrical form of the first thin-film having a magnetic permeability greater than a predetermined level having a thickness within a range of about 1 to 20 microns in a second cylindrical form;
    printing a second thin-film directly onto the second cylindrical form of the permalloy to encapsulate the permalloy onto the first thin-film in a third cylindrical form;
    printing a plurality of conductive traces directly onto a plurality of surfaces of the first-thin-film, the permalloy, and the second thin-film in a fourth cylindrical form to render a current sensor; and
    printing a third film onto the conductive traces to encapsulate the current sensor, the third thin film forming a fin structure that surrounds the cable and that absorbs and dissipates heat produced by the sensor and the cable the sensor it is mounted to;
    where the conductive traces are wrapped around a portion of the cable that it monitors; and
    where the first thin film, the second thin film, and the third thin film comprise a thermoplastic or thermosetting plastic and the the first cylindrical form, the second cylindrical form, and the third cylindrical form include a longitudinal opening sized to receive the cable in a co-axial alignment and protect a portion of the cable from environmental surroundings.

* * * * *